United States Patent

Soellner et al.

[11] Patent Number: 6,079,098
[45] Date of Patent: Jun. 27, 2000

[54] METHOD AND APPARATUS FOR PROCESSING SUBSTRATES

[75] Inventors: Kai Soellner, Waldershof; Stefan Panzer, Munich, both of Germany

[73] Assignee: Siemens Aktiengesellschaft, Munich, Germany

[21] Appl. No.: 09/179,829

[22] Filed: Oct. 28, 1998

[30] Foreign Application Priority Data

Sep. 8, 1998 [DE] Germany .......................... 198 40 999

[51] Int. Cl.$^7$ .............................. H05K 3/30; B23P 19/00
[52] U.S. Cl. .............................. 29/832; 29/739; 29/740; 29/741
[58] Field of Search ............................. 29/832, 833, 740, 29/741, 709, 739

[56] References Cited

U.S. PATENT DOCUMENTS

| | | | |
|---|---|---|---|
| 4,231,153 | 11/1980 | Browne | 29/739 |
| 4,615,093 | 10/1986 | Tews et al. | |
| 4,631,812 | 12/1986 | Young | 29/739 |
| 4,731,923 | 3/1988 | Yagi et al. | |
| 5,003,692 | 4/1991 | Izumi et al. | 29/833 X |
| 5,249,349 | 10/1993 | Kuinose et al. | 29/833 X |
| 5,249,356 | 10/1993 | Okuda | 29/833 |
| 5,437,359 | 8/1995 | Maruyama et al. | 29/739 |
| 5,692,292 | 12/1997 | Asai et al. | |

FOREIGN PATENT DOCUMENTS

| | | |
|---|---|---|
| 0 341 944 | 11/1989 | European Pat. Off. |
| 0 456 218 | 11/1991 | European Pat. Off. |
| 0 591 836 B1 | 4/1994 | European Pat. Off. |
| 41 36 543 A1 | 5/1992 | Germany. |
| 42 33 438 A1 | 4/1994 | Germany. |
| 07 022787 | 1/1995 | Japan. |
| 2 249 672 | 5/1992 | United Kingdom. |
| WO85/02088 | 5/1985 | WIPO ....................................... 29/832 |
| WO 97/38567 | 10/1997 | WIPO. |

Primary Examiner—Carl J. Arbes
Attorney, Agent, or Firm—Hill & Simpson

[57] ABSTRACT

When processing substrates in a plurality of automatic processing units that are arranged following one another, the positional coordinates of the substrates as well as additional geometrical data about circuit markings or function markings, are determined in each automatic processing unit and employed for the processing. The geometrical data is determined only in the first automatic processing unit and is communicated via a bus system to the second automatic processing unit. It is utilized in the second automatic processing unit, which leads to a lower time expenditure.

7 Claims, 1 Drawing Sheet

METHOD AND APPARATUS FOR PROCESSING SUBSTRATES

BACKGROUND OF THE INVENTION

The present invention is directed to a method and apparatus for processing substrates, particularly for equipping the substrates with electrical components.

In the automatic equipping of substrates (for example, printed circuit boards or ceramic substrates) with SMD (surface mounted device) components, the individual components are taken from a magazine or a delivery means with an equipping head and are then positioned on the substrate in a predetermined orientation. The substrates are thereby taken from a magazine and transported onto a processing position in a first automatic processing unit. In this first automatic processing unit, for example, adhesive is applied to the locations of the substrate at which components are to be placed in a second automatic processing unit. The substrates are transported to this second automated processing unit with a conveyor means.

The knowledge of the position of the substrate is thereby required for the exact positioning of components. To that end, position markings (for example, crosses) are applied on the substrate that are registered in the automatic processing unit by a camera and that are interpreted with respect to their relative position relative to the automatic processing unit in an image evaluation unit that follows the camera.

The plurality of circuits can be provided on a substrate, these in turn respectively having circuit markings that are measured in order, for example, to reduce the influence of warping in the substrate on the equipping position. Additionally, non-functioning circuits are marked by function markings, what are referred to as ink points. As a result thereof, the camera with the following image evaluation in it recognizes the faulty circuit and an equipping with components does not ensue.

When complex circuits having many different types of components are equipped, then a plurality of processing stations are arranged in a line, the substrates being conveyed between them. The position markings, the circuit markings and the function markings are thereby measured and evaluated in every processing station. This requires a correspondingly large time expenditure.

In automatic equipping units of the FUJI Machine Company, however, it is known to transport the substrates on workpiece carriers that are provided with exact fixing means. As a result thereof, the measuring of following automatic equipping units is eliminated. However, a great plurality of expensive workpiece carriers must be kept on hand.

SUMMARY OF THE INVENTION

It is an object of the present invention to provide a method and apparatus for processing substrates, whereby the time expenditure for measuring and for processing geometrical data of the substrate is minimized given little apparatus outlay.

It is thereby provided that the geometrical data of the substrate is only measured in a first of a series of automatic processing units, and the geometrical data is communicated to the further automatic processing units. As a result thereof, only the positional coordinates of the substrate need be measured in each automatic processing unit, this approaching the time expenditure for measuring to the time expenditure given the employment of workpiece carriers, so that workpiece carriers can be eliminated.

Advantageously, the geometrical data is determined by the optical measuring of markings applied on the substrate. This leading to an adequately exact position identification.

In a further embodiment the positional coordinates are determined simply and adequately precisely by optical measuring of markings applied on the substrate.

In another preferred embodiment the geometrical data is also communicated to further automatic processing units that are traversed by the substrate, this leading to a time expenditure that is reduced further.

The inventive apparatus has a bus system for the transmission of the measured data between the control devices of the automatic processing units and uses the same measuring station for determining the positional coordinates and the geometrical data.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
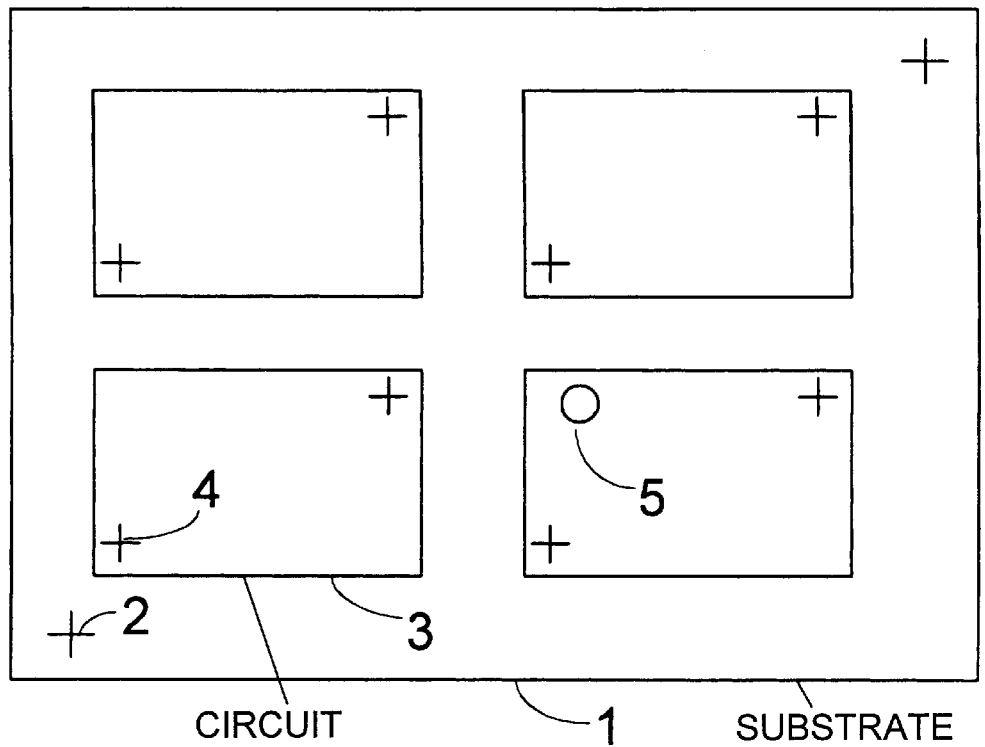
FIG. 1 depicts a substrate with schematically indicated markings.

In FIG. 1, a substrate 1, for example a printed circuit board or a ceramic substrate, is marked with two crosses as position markings 2 that are applied in opposite corners. Four circuits 3 are located on the substrate, these circuits 3 in turn have crosses as circuit markings 4. One of the circuits 3 additionally has a function marking 5, what is referred to as an "ink point", that was applied in order to document that this circuit is faulty and should not be equipped.

Figure 2:
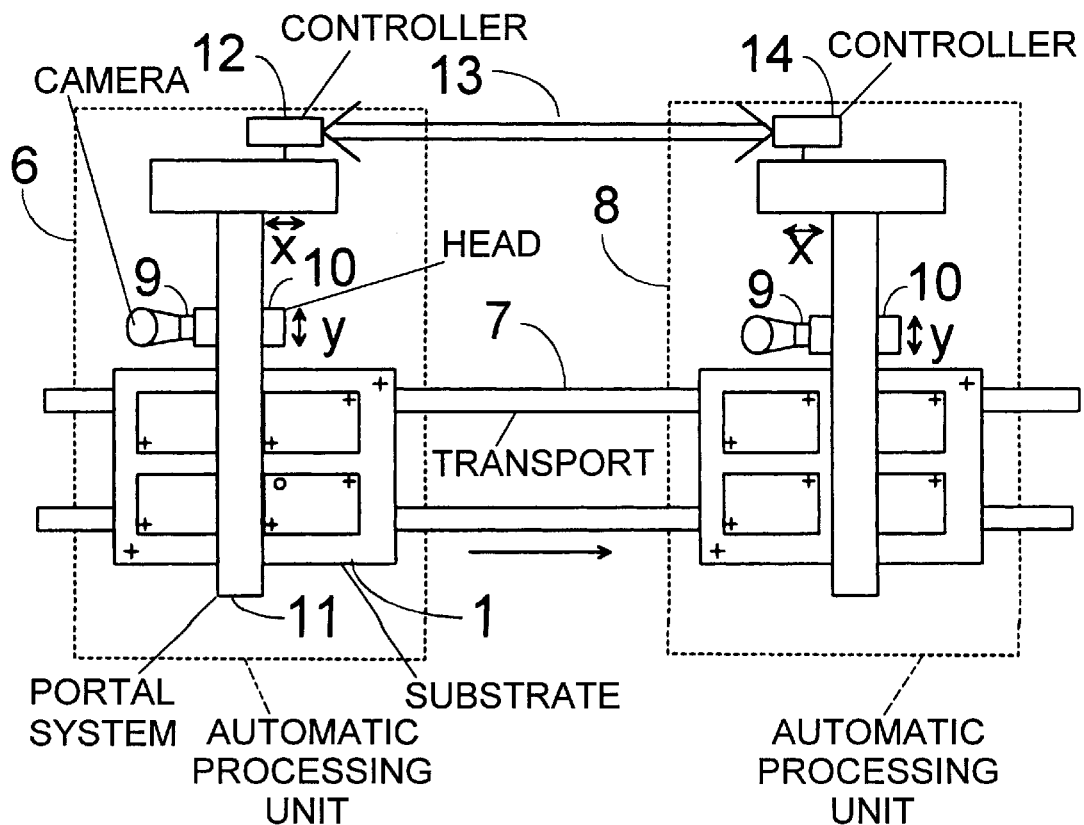
FIG. 2 is a schematic illustration of two automatic processing units and substrates in a plan view.

FIG. 2 schematically shows a first automatic processing unit 6 and a second automatic processing unit 8 that are connected via a transport mechanism 7. The substrate, after being processed in the first automatic processing unit 6, is conveyed into the second automatic processing unit 8 via this transport mechanism 7, for example a belt system. The substrate 1 is at least temporarily fixed in the automatic processing units 6, 8 in order to undertake the processing. The two automatic processing units can thereby be, for example, a gluing station and an automatic equipping unit. Alternatively, there can be two automatic equipping units, whereof each has a specific supply of component types. Further processing stations can follow in an analogous manner.

The markings 2, 4, 5 are measured in the first automatic processing unit 6 with a measuring station 9, for example a camera with following image evaluation unit, and the appertaining positional coordinates and geometrical data of the circuit markings 4 and of the function markings 5 are stored in the first control means 12 that is allocated to the first automatic processing unit 6. The measuring station 9 is secured to an equipping head 10 that is moveable over the substrate in X-Y direction via a portal system 11. The positional coordinates and the geometrical data are taken into consideration in the first automatic processing unit 6 in the following processing of the substrate.

Subsequently, the substrate 1 is conveyed into the second automatic processing unit 8 via the transport mechanism 7 and is likewise at least temporarily fixed there for the processing. In order to identify a relative position between the substrate 1 and the second automatic processing unit 8 that differs from the relative position between the substrate 1 and the first automatic processing unit 6, the positional coordinates are determined with reference to the position markings 2 using the measuring station 9 of the second automatic processing unit 8. The other geometrical data of the circuit markings 4 and the function markings 5 are communicated from the first control means 12 via a data bus 13 to the second control means 14 that is allocated to the second automatic processing unit 8. The communication can thereby ensue directly from the first control means 12 to the second control means 14 or can also ensue via an intervening central unit (not shown). As a result, this geometrical data need not be identified first in the second automatic processing unit 8. This results in a lower time expenditure and, thus, a higher processing speed.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A method for processing substrates in at least two automatic processing units, comprising the steps of:

at least temporarily holding a substrate in a first automatic processing unit;

identifying positional coordinates and geometrical data of the substrate;

performing a predetermined processing operation on the substrate based, in part, on the positional coordinates and the geometrical data;

conveying the substrate to a second automatic processing unit and at least temporarily holding the substrate in the second automatic processing unit;

communicating the geometrical data from the first automatic processing unit to the second automatic processing unit;

identifying the positional coordinates of the substrate in the second automatic processing unit; and performing another predetermined processing operation on the substrate based, in part, on the positional coordinates in the second automatic processing unit and the geometrical data communicated to the second automatic processing unit by the first automatic processing unit.

2. The method for processing substrates according to claim 1, wherein the geometrical data is determined by optical measuring of markings applied on the substrate.

3. The method for processing substrates according to claim 1, wherein the positional coordinates are determined by optical measuring of positional markings applied on the substrate.

4. The method for processing substrates according to claim 1, wherein when processing the substrate in a plurality of automatic processing units having more than two automatic processing units, the geometrical data is also transmitted to further automatic processing units in the plurality of automatic processing units.

5. A method for equipping substrates with electrical components in at least two automatic processing units, comprising the steps of:

at least temporarily holding a substrate in a first automatic processing unit;

identifying positional coordinates and geometrical data of the substrate, the geometrical data being determined by optical measuring of markings applied on the substrate, the positional coordinates being determined by optical measuring of positional markings applied on the substrate;

performing a predetermined processing operation on the substrate based, in part, on the positional coordinates and the geometrical data consideration;

conveying the substrate to a second automatic processing unit and at least temporarily holding the substrate in the second automatic processing unit;

communicating the geometrical data from the first automatic processing unit to the second automatic processing unit;

identifying the positional coordinates of the substrate in the second automatic processing unit; and performing another predetermined processing operation on the substrate based, in part, on the positional coordinates in the second automatic processing unit and the geometrical data.

6. The method for processing substrates according to claim 5, wherein when processing the substrate in a plurality of automatic processing units having more than two automatic processing units, the geometrical data is also transmitted to further automatic processing units in the plurality of automatic processing units.

7. An apparatus for processing substrates comprising:

at least two automatic substrate processing units for performing a respective predetermined processing operation, each of the at least two automatic substrate processing units having a corresponding measuring station for determining measurement data from markings on substrates undergoing processing and a corresponding controller that controls the automatic substrate processing unit and stores the measurement data;

a conveyor for conveying substrates between the at least two automatic substrate processing units; and a data bus connected to the at least two automatic substrate processing units for communicating the measurement data between the at least two automatic substrate processing units.

\* \* \* \* \*